(12) United States Patent
Siniaguine et al.

(10) Patent No.: US 6,238,587 B1
(45) Date of Patent: May 29, 2001

(54) METHOD FOR TREATING ARTICLES WITH A PLASMA JET

(75) Inventors: Oleg Siniaguine, San Jose, CA (US); Iskander Tokmouline, New Fairfield, CT (US)

(73) Assignee: Ipec Precison, Inc., Bethel, CT (US)

( * ) Notice: Subject to any disclaimer, the term of this patent is extended or adjusted under 35 U.S.C. 154(b) by 0 days.

(21) Appl. No.: 09/194,141

(22) PCT Filed: May 28, 1997

(86) PCT No.: PCT/US97/09069

§ 371 Date: Nov. 25, 1998

§ 102(e) Date: Nov. 25, 1998

(87) PCT Pub. No.: WO97/45856

PCT Pub. Date: Dec. 4, 1997

(51) Int. Cl.$^7$ ..................................................... B05D 1/00
(52) U.S. Cl. ................................................ 216/59; 216/67
(58) Field of Search ........................................ 216/59, 67

(56) References Cited

U.S. PATENT DOCUMENTS 5,474,642    12/1995    Zorina et al. .

FOREIGN PATENT DOCUMENTS

| | | |
|---|---|---|
| 0545460 | 6/1993 | (EP) . |
| 5070290 | 3/1993 | (JP) . |
| 7172986 | 7/1995 | (JP) . |
| 2003201 | 11/1993 | (SU) . |
| 2032281 | 3/1995 | (SU) . |
| 9117285 | 11/1991 | (WO) . |
| 9212273 | 7/1992 | (WO) . |
| 9212610 | 7/1992 | (WO) . |
| 9307908 | 4/1993 | (WO) . |
| 9309261 | 5/1993 | (WO) . |

OTHER PUBLICATIONS

Article entitled "Dynamical Plasma Operating (DPO) of Solid Surfaces" by P.P. Kulik, Engineering Center "Plasmodynamics" 103482, Moscow, Russia, from *Plasma Jets in the Development of New Materials*, pp. 639–653, editors Solonenko and Fedorchenko, copyright VSP Sep. 1990.
Article in Russian, pp. 4–13 and 58–96, dated 1987.
Article in Russian, pp. 131–151, dated 1989.
*Dynamical Plasma Treatment of HIC (Hybrid Integrated Circuits) Substrates* by U. Agrikov, P. Kulik, L. Poplevina and V. Ivanov, in original Russian language and English translation from Russian, excerpt from *Electronic Techniques*, Ser. 10, Microelectronic Devices, 5(71), 1988, pp. 30–32, Russia.

*Primary Examiner*—Randy Gulakowski
*Assistant Examiner*—Allan Olsen
(74) *Attorney, Agent, or Firm*—Snell & Wilmer L.L.P.

(57) ABSTRACT

A method for treating an article with a plasma jet is disclosed. The method involves rotating an article (30) with a surface (32) to be treated about an axis (Ha), wherein the rotation defines a rotation radius extending from the axis. The article surface is contacted with the plasma jet (10) to form a plasma jet footprint (11) having a predetermined dimension on the article surface. The plasma jet footprint is moved along the rotation radius in the radial direction according to a velocity profile along the rotation radius so as to apply heat to the article surface to obtain a desired temperature distribution profile on the article surface along the rotation radius. The method provides a means for controlling the temperature of the article uniformly in a temperature range from about 30° C. and 1200° C. to allow different treatment applications to be performed on the article. The control of article temperature as described allows for uniform treatment processes, such as polymer ablation, etching, deposition and thermal treatment, of the article material itself by injecting different gasses into the plasma jet.

9 Claims, 4 Drawing Sheets

METHOD FOR TREATING ARTICLES WITH A PLASMA JET

BACKGROUND

1. Field of the Invention

The present invention relates to a method for treating the surface of articles, such as silicon wafers, with a plasma jet. More particularly, the present invention relates to a method for moving a plasma jet tool relative to the surface of an article being treated by the plasma jet tool.

2. Description of the Prior Art

A plasma jet is a confined and very intensive heat source. Typically, plasma jet tools have a cross section or footprint which is significantly less than the cross sectional area of a surface of an article, such as a silicon wafer, being treated by the plasma jet. Prior art plasma jet treatment of articles typically involves the production of a plasma jet which is directed at the article's surface. While the plasma jet is directed at the article's surface, the plasma jet is moved relative to the surface, usually by linear scanning, such as an X-Y linear scan.

Such prior art plasma jet treatment methods using linear scanning can result in damage caused by local overheating of the surface. In the case of silicon wafers, local overheating can result in crystal structure defects, wafer melting, high temperature gradient induced stresses, and breakage. Also, with prior art plasma jet wafer treatment methods, providing uniformity of plasma jet treatment to wafers of differing dimension can be problematic.

More specifically, several deficiencies in prior art linear scanning methods include low throughput and high potential for wafer damage. Every linear movement of the plasma jet across the wafer produces hot lanes at the wafer surface with cold surfaces adjacent thereto. The hot lanes tend to produce high temperature gradients, which in turn causes stress in the wafer. In order to avoid high temperature gradients, a delay must be made between adjacent hot lanes to allow for partial cooling of a previous hot lane and lowering of temperature gradients to avoid wafer surface overheating or thermal stress induced wafer damage. As many linear scan movements have to be made to treat the entire wafer surface with sufficient delays to prevent thermal damage to the wafer, resulting wafer treatment throughput suffers.

The linear scan methods of the prior art also have the drawback that surface treatment quality suffers due to redeposition on the wafer surface caused by the contact of etch products with cold wafer surface near a hot lane.

SUMMARY OF THE INVENTION

The present invention relates to a method for treating a surface of an article with a plasma jet. According to the method, an article having a surface to be treated and a plasma jet is provided. The article is rotated about an axis so as to define a rotation radius. The plasma jet is contacted with the surface of the article so as to have a plasma jet footprint of predetermined dimension. The plasma jet is moved along the rotation radius of the article according to a velocity profile so that the surface of the article is heated to obtain a desired temperature distribution profile on the article surface as measured along the rotation radius.

It is one object of the present invention to provide a method which can achieve a relatively high process throughput without increasing potential article damager.

The foregoing and other objects, features, and advantages will become apparent from the detailed description of the preferred embodiments invention as illustrated in the accompanying drawings.

BRIEF DESCRIPTION OF THE DRAWINGS

The drawings, which are not drawn to scale, include.

DETAILED DESCRIPTION OF THE INVENTION

Figure 1:
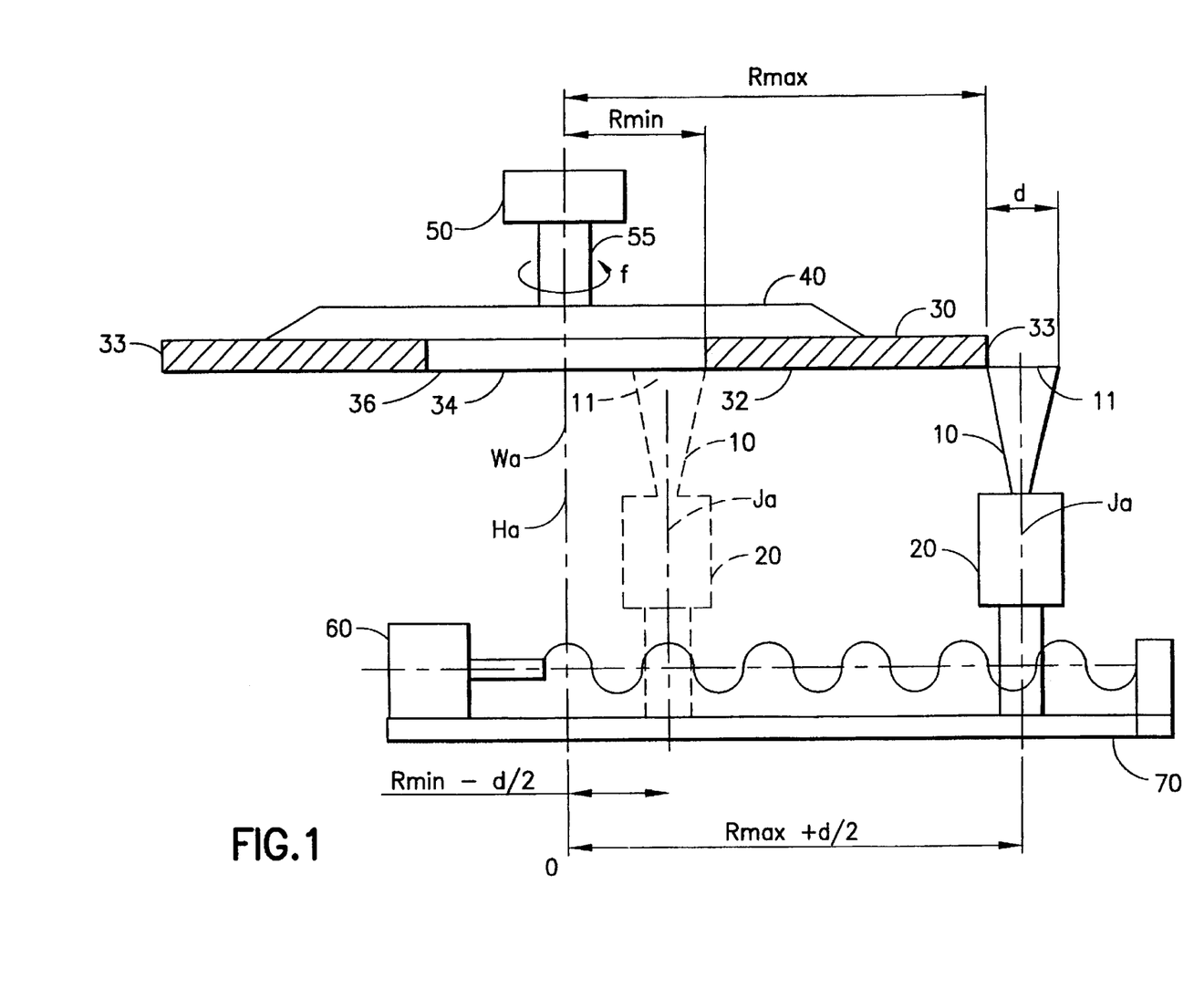
FIG. 1, which is a schematic diagram of a plasma jet apparatus for carrying out the method of the present invention.
Figure 2:
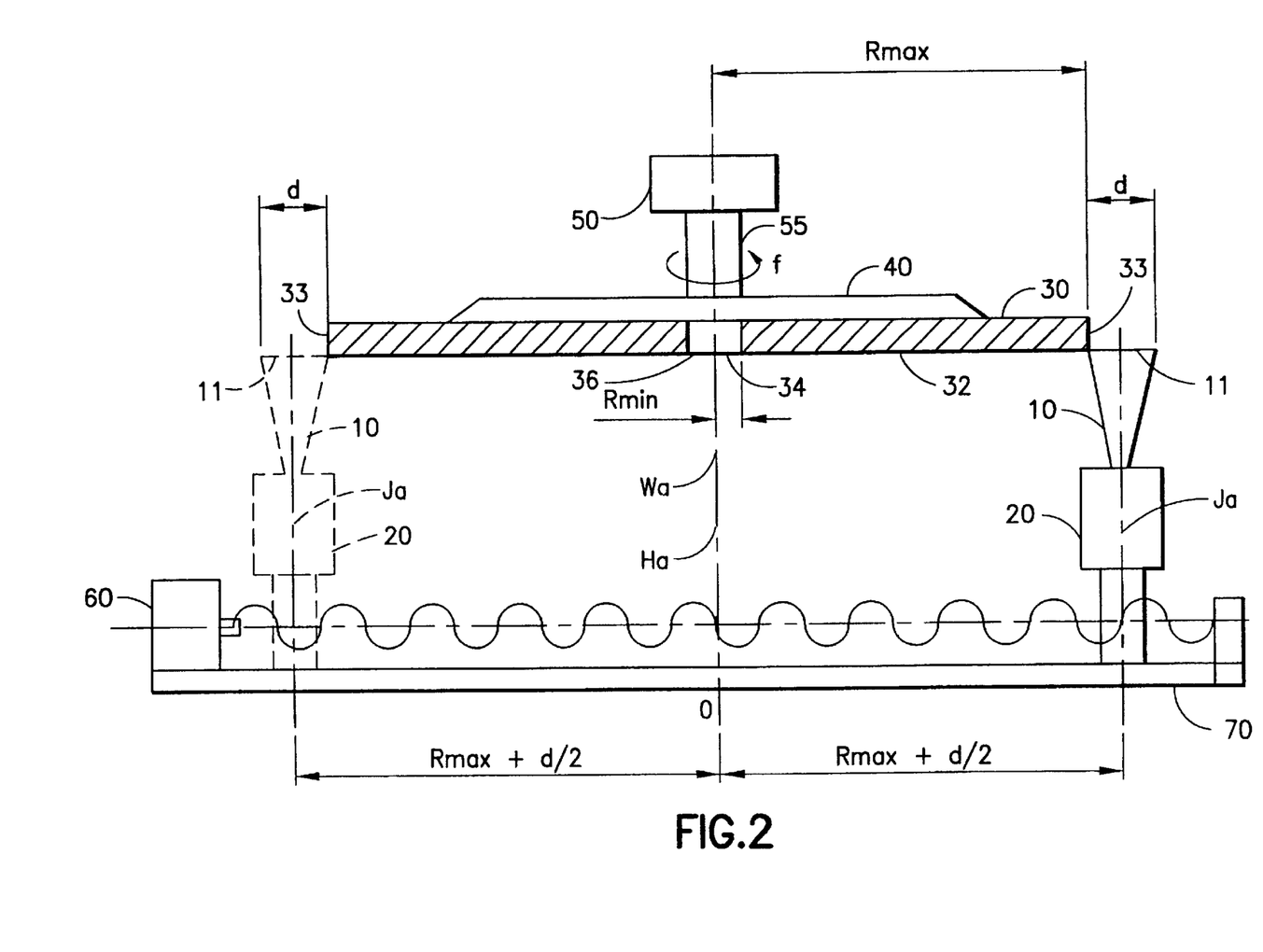
FIG. 2, which is a schematic diagram of an alternative plasma jet apparatus embodiment for carrying out the method of the present invention.

Referring to FIGS. 1 and 2, a plasma jet 10 is produced by plasma jet generator 20 of any known type, which is located in a plasma jet process chamber (not shown). The ambient gas pressure of the plasma jet process chamber is maintained at about atmospheric pressure. In FIGS. 1 and 2, the plasma jet generator 20 is preferably oriented so that the plasma jet 10 is directed upwards, relative to the force of gravity, towards a wafer-like article 30, such as a silicon wafer, which is held in position on holder 40. The article 30 may be secured to the holder 40 by a vacuum chuck or any other known article holding means. Article 30 having a surface to be treated 32 is oriented on the holder 40 such that the surface 32 faces the plasma jet 10, which as illustrated in FIGS. 1 and 2, is a generally downward orientation. Generally, during processing with the plasma jet, the holder 40 is rotated by motor 50 with revolution frequency f. Also, the article 30 is positioned on the holder 40 so that the rotation axis Ha of the holder 40 is coincident with the articles's inertial center or rotational axis Wa.

As will be explained in more detail below, the revolution frequency f of the article 30 about axis Wa, and corresponding duration, is chosen to be less than the time it takes for the temperature of a point on the surface heated at the beginning of a revolution to cool to the temperature the surface point had just before the beginning of the revolution of the article. Under these processing conditions, only a gradual heating of every point on the surface 32 of the article 30 is caused by the crossing of the plasma jet over the surface 32 of the article 30 during rotation thereof. By simultaneously moving the plasma jet along the articles' rotation radius and changing the rotation frequency of the wafer, high temperature gradients and thermal stress damage can be avoided.

The duration of the cooling of a point on the surface 32 of an article 30, such as a silicon wafer, may be estimated by using well-known theory of non-stationary heat conductivity. For example, assuming that article 30 is a silicon wafer with thickness less than about 1 mm, has uniform temperature distribution in volume due to high heat conductivity and that it is cooled mainly by convectional heat transfer to ambient gas with constant temperature $T_o$ from both sides, the wafer's cooling may be described by the equation $$mCh\frac{\delta(T_s(t)-T_0)}{\delta t} = 2\alpha(T_s(t)-T_0)$$

where: m=Si density;
C=Si heat capacitance;
h=wafer thickness;
Ts(t)=wafer surface temperature;
To=ambient gas temperature; and
α=heat transfer coefficient.

Assuming that just before beginning of revolution (i+1), the temperature of wafer surface was $T_i$ and during the beginning of (i+1) revolution the wafer surface was heated up to temperature $T_{i+1}$, then from the equation (1) the wafer revolution duration for which wafer surface temperature decreases from $T_{i+1}$ back to $T_i$ may be estimated:

$$t_{max} = \frac{mCh}{2\alpha}\ln\left(\frac{T_s(t)-T_0}{T_{i+1}-T_0}\right) = \frac{mCh}{2\alpha}\ln\left(\frac{T_i-T_0}{T_{i+1}-T_0}\right)$$

According to the method of the present invention, the duration of every wafer revolution should be chosen so that the temperature of the wafer surface caused by heating from the plasma jet is less than $t_{max}$ and frequency f of wafer rotation should be chosen $f > f_{min} = 1/t_{max}$.

Figure 3:
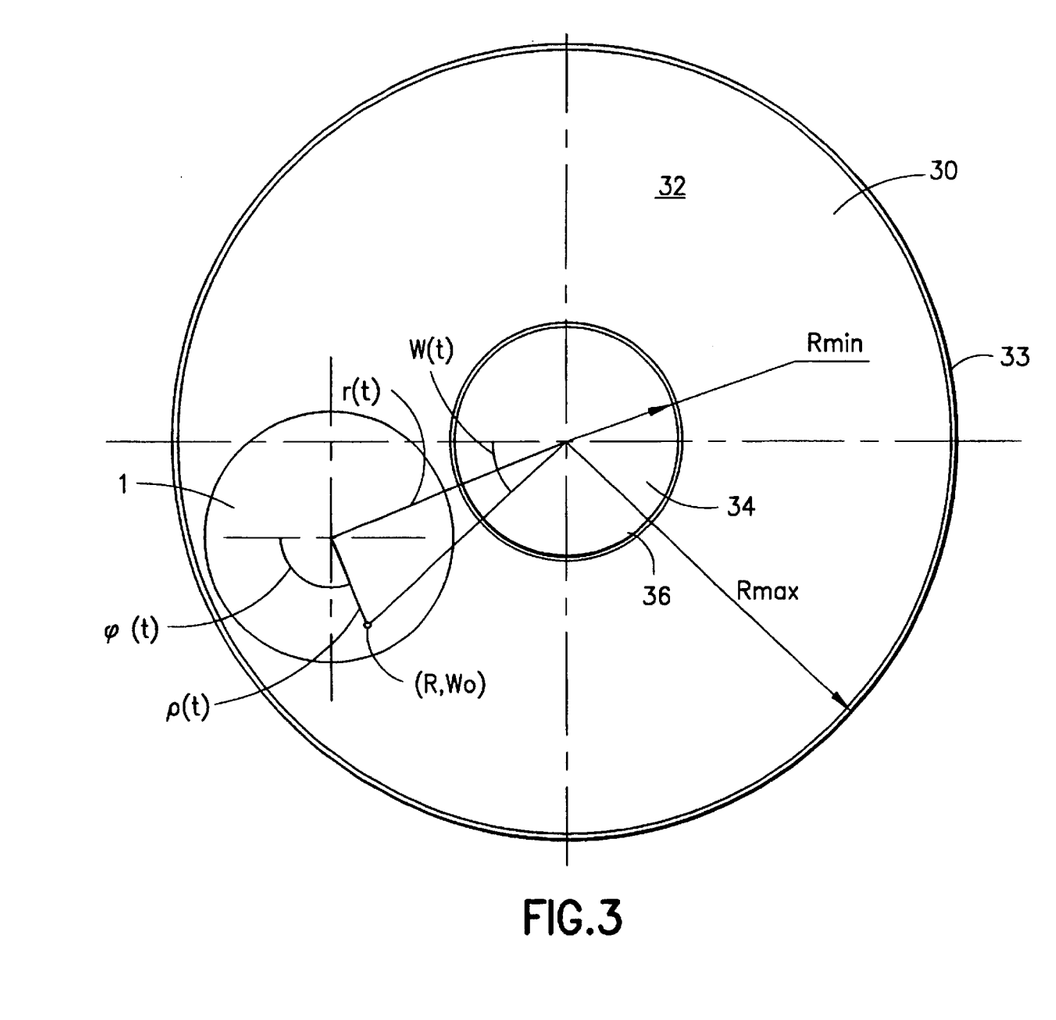
FIG. 3, which is a plan view of a circular wafer-like article, illustrating the footprint of a plasma jet applied thereto.

According to the method of the present invention, the plasma jet 10 may be directed at an angle to the article's surface 32. The angle between plasma jet 10 and the surface 32 influences the conditions of plasma flowing along surface 32. Referring to FIG. 3, when the angle of the plasma jet 10 directed at the surface 32 of the wafer 30 is 90°, in other words, when the angle of the plasma jet 10 is normal to the surface 32, the plasma spot or plasma footprint 11 on the surface 32 tends to be symmetrical and the plasma properties within plasma footprint 11 on the surface 32 are more uniform than when the plasma jet is directed at the wafer surface at an angle which is less than 90°. Preferably, in the method of the present invention, the plasma jet 10 is directed at the surface 32 in a normal orientation so as to provide the uniform footprint 11.

Referring to FIGS. 1 through 3, according to the present invention, the plasma jet 10 is moved relative to the surface 32 typically between a first surface point having maximum rotation radius $R_{max}$ and a second wafer surface point having a smaller rotation radius $R_{min}$. Movement of the plasma jet 10 may be done with any trajectory along the surface 32 because only the velocity vector component directed along the wafer rotation radius R is important for realization of this method. The relative movement of the plasma jet may be done by supporting the plasma jet on a rail 70 and connecting the generator 20 to a worm gear or screw transmission 80 which is driven by motor 60. The rail 70 is placed parallel to surface 32 and along wafer rotation radius R.

Because the plasma jet footprint 11 has limited cross sectional dimension d in the plane of the surface 32, it is convenient to determine the instaneous position of the plasma jet 10 relative to the surface 32 by the measuring or noting the distance between the article rotation axis Wa and the plasma jet axis Ja. Referring to FIGS. 1 and 2, the plasma jet 10 starts interacting with the surface 32 at the point of maximum rotation radius $R_{max}$ when it is located at position (R+d/2). Due to the rotation of the motor 60, the plasma jet generator 20 is moved along surface 32 and the plasma jet spot or footprint 11 on the surface 32 is moved towards the article surface points that have a minimal rotation radius, $R_{min}$.

There are two possible variations of movement of the article 30 relative to the plasma jet 10 and the two variations depend on the article type and location of its rotation axis Wa. Referring to FIG. 1, the first variant occurs when the rotation axis Wa is located out of the article 30 and at a distance which is more than d/2 from the outer edge 33 of the article 30, or when the article 30 has an opening 34 with a dimension which is more than plasma jet footprint 11 dimension d and the wafer's rotation axis is located within the opening 34 at a distance which is more than d/2 from its inner edge 36. In these cases, minimal rotation radius $R_{min}$ is more than half the plasma jet's footprint's 11 dimension (d/2). Complete treatment of surface 32 is achieved after reaching a distance which is less than $R_{min}+d/2$ between rotation axis Wa and plasma jet footprint axis Ja. When the plasma jet 10 reaches its limit, it may be either turned off or moved further and stopped in the range between 0 and $R_{min}-d/2$ without incurring damage to the article 30.

Referring to FIG. 2, in the second variant, the rotation axis Wa is located out of the article 30 and positioned less than d/2 from the outer edge 33 of the article 30 or the article has an opening 34 having a cross sectional dimension which is larger than the plasma jet footprint 11 dimension d and the article rotation axis Wa is located within the opening 34 and distanced less then d/2 from the inner edge 36 or the article has an opening 34 with a dimension which is less than plasma jet footprint 11 dimension d or no opening at all ($R_{min}=0$). In these cases minimal rotation radius $R_{min}$ is less than half the plasma jet footprint's dimension (d/2). Complete treatment of article surface 32 is achieved after reaching a location which is less than $(R_{min}+d/2)$ between article rotation axis Wa and plasma jet footprint axis Ja. Then the plasma jet has to be either turned off or moved back toward wafer points with $R_{max}$ and stopped at the distance which is greater than $(R_{min}+d/2)$ between the article rotation axis Wa and plasma jet axis Ja. In the later case wherein the plasma jet is not turned off, the article surface 32 is actually treated twice.

Relative movement velocity v(R) is changed by controlling the frequency of motor 50 having a shaft 55 which is connected to holder 40 to cause holder 40 to rotate. The velocity of the plasma jet 10 relative to the article 30 around any rotation radius R is given by $2\pi fR$, and is chosen to be greater than the velocity providing the plasma jet shift in the radial direction of the article, v(R). For one revolution of the article, the heat input from the plasma jet around the rotation radius spreads in the article material due to heat conductivity for a duration time equal to a revolution, $t_{rev}$. From the theory of non-stationary heat conductivity the heat spreading length $I_{heat}$ for duration $t_{rev}$ of wafer revolution may be estimated as:

$$I_{heat} = 3\sqrt{at_{rev}}$$
$$a = \frac{\lambda}{mc}$$

where:

λ is the heat conductivity of wafer material.

The requirement for not developing a radial thermal gradient gives the condition:

$$v(R)t_{rev} > I_{heat}$$

or $$v(R) > 3\sqrt{\frac{a}{t_{rev}}}$$

For $R<d/2$, the maximum velocity in the radial direction $v_{max}(R)$ is given by the requirement for uniform treatment, that the plasma jet shift in the radial direction be less than the plasma jet dimension D over the duration of one revolution, $t_{rev}$.

The plasma jet foot print 11 on the wafer surface has dimension d, which is about several centimeters and non-uniform distribution of heat flux. That distribution may be measured by calorimeter or any other known means.

Referring to FIG. 3, from the theory of non-stationary heat conductivity, the temperature of an article wafer at a point with coordinate $(R, W_o)$ may be described by differential equation:

$$mCh \frac{\delta(\Delta T(t))}{\delta t} = q_{pl}(\rho(t), \varphi(t)) - q_{cool}(R, W_0 \Delta T(t)) \quad (*)$$

where:

$\Delta T(t) = T_s(t) - T_o$;

$T_s(t)$ is article surface temperature at the point $(R, W_o)$ and is less than temperature of article surface material damage;

$T_o$ is the ambient gas temperature;

$q_{p1}(\rho(t), \rho(t))$ is the heat flux distribution from the plasma jet in polar coordinates with instantaneous center at point=0; and $q_{cool}(R, Wo, \Delta T(t))$ is the cooling heat flux at wafer surface point with coordinates $(R, W_o)$.

The article is rotated around the axis through the point $R=0$ and at the same time the distance $r(t)$ between wafer rotation axis and plasma jet center is changed due to relative plasma jet to article movement, $v(R)$ and consequently so:

$$\rho(t) = R^2 - r^2(t) - 2Rr(t)\cos(W(t) + W_o) \quad (**)$$

$$\phi(t) = \arctan(R\sin(W(t) + W(t) + W_o)/(r(t) - R\cos(W(t) + W_o)))$$

Solution of the equations (*) and (**) by routine numeric integration allows the determination of function $r(t)$ and $W(t)$ which provides a method for achieving required article surface temperature at every article surface point for concrete given conditions. Relative movement velocity function is determined by differentiation of $r(t)$.

For practical use the relative movement velocity function may be found by routine experimental procedure. For simplicity the rotation frequency f is fixed and the article 30 is to be heated from initial temperature To the temperature $T_w(R)$. In step 1, the velocity $v(R)$ is chosen arbitrarily from the range limited by the above mentioned conditions and may be taken as constant. In step 2, one plasma jet pass along the article surface 32 is made. In step 3, the temperature distribution $T_{heat}(R)$ along article's radius R is measured. In step 4, the real temperature distribution $T_{heat}(R)$ is compared with desirable $T_w(R)$ and if difference between $T_{heat}(R)$ and $T_w(R)$ is unacceptable then the velocity function is changed according to the relation $v(R) = ((T_{heat}(R) - T_o)/(T_w(R) - T_o))v(R)$ and the procedure is repeated from Step 2. If the difference between $T_{heat}(R)$ and $T_w(R)$ is acceptable then the procedure is stopped and found optimal velocity function $v_{opt}(R)$ may be used for article treatment.

This procedure may be extended to a general iterative procedure to obtain an optimal velocity function, $v_{opt}(R)$.

For each iteration, a new velocity function, $v_{i+1}(R)$ can be obtained from the previous velocity function $v_i(R)$; the measured temperature profile across the wafer, $T_{heat,i}(R)$, obtained when executing the velocity function $V_i(R)$; and the previously measured temperature profile, $T_{heat,i-1}(R)$, obtained when executing the velocity function $v_{i-1}(R)$:

$$v_{i+1}(R) = (T_{heat,i}(R) - T_{heat,i-1}(R))/T_w(R) - T_{heat,i-1}(R))V_i(R) \quad (iii)$$

These iterations can be repeated until the measured temperature at all points, $T_{heat,i}(R)$ is acceptably close to the desired temperature $T_w(R)$. The velocity function for this iteration can then be used for the temperature treatment process and is an optimum velocity function, $v_{opt}(R)$.

In practice, to prevent damage to the article surface 30 due to thermal stress, the temperature distribution after every pass will be constant to within some acceptable temperature difference, $T_d$. The temperature of all points on surface 32, at all radii, should be within an acceptable temperature difference of the surface point with minimum rotation radius or $T_w(R) = T(R_{min}) \pm T_d$.

Having determined $v_{opt}(R)$, the velocity function, $v^*_{opt}(R)$, to change the article temperature from $T_w(R)$ to another desired temperature $T^*_w(R)$ may be obtained by:

$$v^*_{opt}(R) = ((T^*_w(R) - T_0/T_w(R) - T_0)v_{opt}(R) \quad (iv)$$

The temperature to which the article should be heated depends on application requirements, for example:

1000–1100° C. for poly-Si layer recrystallization;

900–1000° C. for activation of ion implanted dopants;

500–600° C. for reflowing BPSG; and so on.

Plasma jet treatment may be used for thin polymer film removal or polymer photo resist stripping from the article surface. For these applications, the relative movement velocity along article rotation radius is chosen less then velocity providing heating polymer film surface on article surface up to polymer ablation temperature. Specific polymer ablation temperature is usually very close to polymer melting temperature and may be obtained from handbooks on polymer properties. The value $v_{abl}(R)$ which provides that article temperature $T_{abl}$ is determined from equation (*) or from experimental data and relation that follows from equation (iv):

$$v_{abl}(R) = ((T_{abl} - T_o)/(T_w - T_o)) * v_{opt}(R),$$

where: $v_{opt}(R)$ is the relative movement velocity known from the experiments providing wafer heating to the temperature $T_w$.

Figure 4:
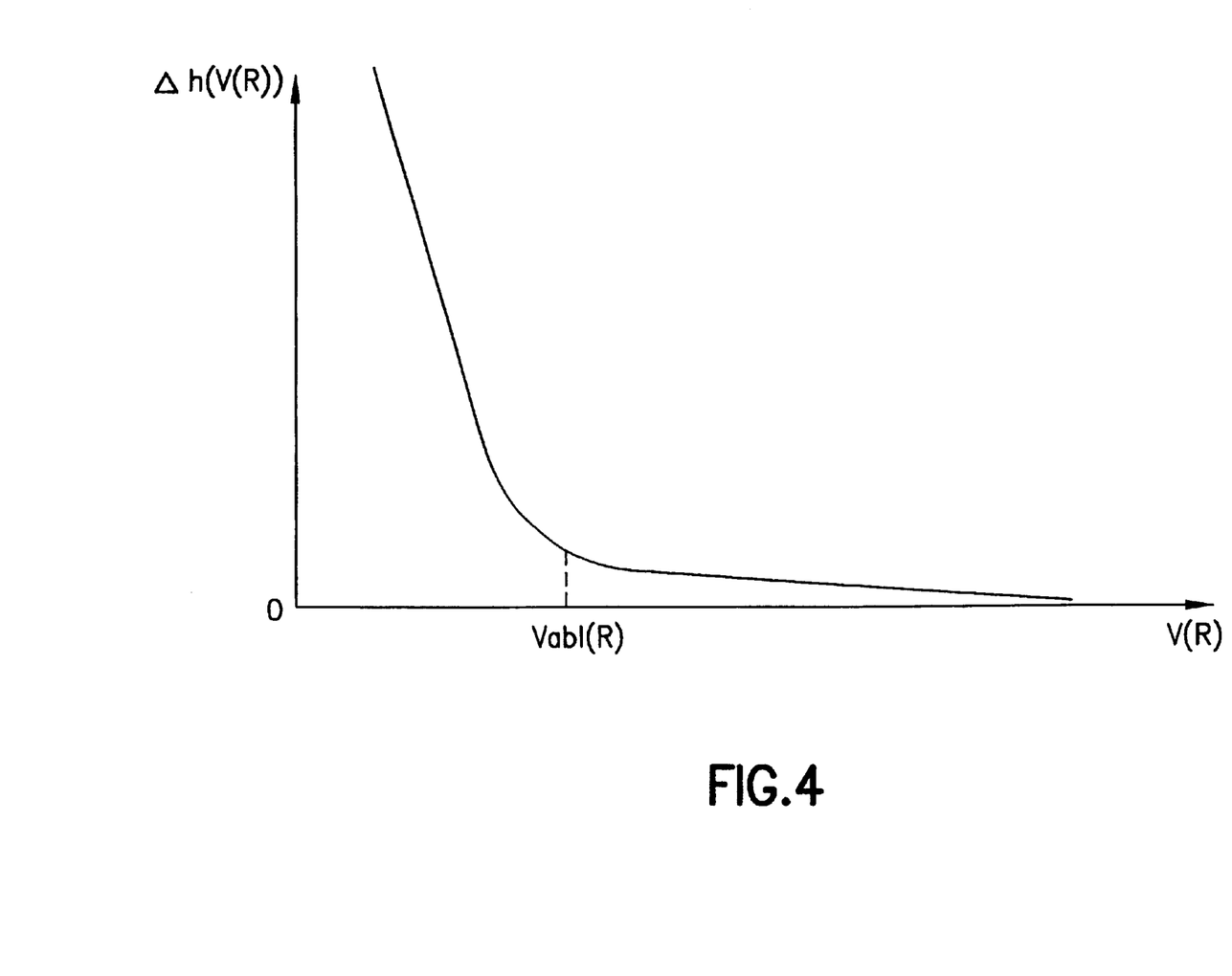
FIG. 4, which is a graph showing the relationship of removal thickness of a polymer by ablation for a given velocity.

If the polymer ablation temperature is unknown then the $v_{abl}(R)$ may be found experimentally by the following procedure. For given inert gas plasma jet parameters, the polymer removal thickness $\Delta h$ is measured for different values $v(R)$. A typical plot $\Delta h$ versus $v(R)$ is shown at FIG. 4. The $v_{abl}(R)$ is the value where the curve has sharp slope change.

The velocity $v_{abl}(R)$ is threshold for starting of polymer ablation. All velocity values $v(R) < v_{abl}(R)$ provide polymer ablation and removal without dependence on whether the plasma jet consists of chemical reactants or not. The smaller $v(R)$, the greater removal thickness during each pass.

To provide uniform ablation removal of the polymer within the article, the relative movement velocity $v(R)$ $(v(R) < V_{abl}(R))$ along article rotation radius Wa is changed depending on the distance between plasma jet footprint 11 at the article surface 32 and article rotation axis Wa so that the removal thickness of the polymer at article surface points at all rotation radii be equal to removal thickness at article surface points at the minimum rotation radius.

For practical use, the velocity function for the relative movement of the plasma jet relative to the axis of rotation of the article 30 may be determined directly from measured polymer ablation removal by the following steps. First, the velocity v(R) is chosen from the range v(R)<$v_{abl}$(R); it may be taken as the velocity function that provides uniform heating of the article. Second, one plasma jet pass over the article is made. Third, the polymer thickness removal Δh(R) is measured along the article radius in steps Δr. An average polymer thickness removal $\Delta h_{av}$ can then be calculated:

$$\Delta h_{av} = (\Delta r / R_{max}) \Sigma \Delta h(R_i)$$

Fourth, the measured polymer removal Δ(R) is compared to the average removal Δh(R); if the difference between $\Delta h_{av}$ and Δh(R) is unacceptable, a new velocity function v*(R) is recalculated according to the function v*(R)=(Δh(R)/$\Delta h_{av}$) v(R). If the difference between $\Delta h_{av}$ and Δh(R) is acceptable, then the procedure is stopped and then an optimum velocity function $v_{opt}$(R)=v(R) may be used for polymer removal. In general, an iterative procedure similar to that described for determining an optimum velocity profile for temperature treatment, equation (iii), could be used for repeated iterations with measured polymer removal.

To obtain the desired polymer removal thickness $\Delta h_{des}$ the velocity $v_{des}$(R) may be obtained as:
$v_{des}$(R)=($\Delta h_{des}$/$\Delta h_{av}$)*$v_{opt}$(R).

If the polymer layer thickness H to be removed is more than the removal thickness Δh for one pass, the treatment is repeated until complete polymer removal is achieved. The minimal necessary quantity N of required passes may be estimated as: N=H/Δh.

Referring to FIG. 4, note that for velocity values v(R) >$v_{abl}$(R), removal by ablation with an inert gas plasma jet is insignificant. In the case that the plasma jet contains chemically active reactants, such as oxygen or hydrogen, then the polymer is removed by the plasma jet by chemical reactions, commonly referred to as ashing, but with a much lower rate than is possible by ablation removal.

For providing plasma etching of article material or other materials on the article's surface 32, a reactant which is able to produce volatile chemical substance with the material components is added to plasma jet. The greater the reactant concentration in the plasma jet 10, the greater the etching rate. The reactant may be fluorine containing gas (freon, $SF_6$, $NF_3$, etc.) for etching Si, poly-Si, $SiO_2$, $Si_3N_4$, other Si-based materials, $M_o$, Ti, W, Cr. It may be chlorine containing gas ($CCl_4$) for etching Aluminum. It may be oxygen or hydrogen for etching polymers such as photo resists, or polyimide.

To provide uniform etch removal of the material within the article 30, the relative movement velocity of the plasma jet 10 along the article's rotation radius R is changed depending on the distance between the plasma jet footprint 11 at the article surface 32 and the article rotation axis Wa to provide a removal thickness of wafer surface material at wafer surface points at all rotation radii be equal to removal thickness at the wafer surface point with minimal rotation radius. During one plasma jet pass along the wafer, the etch removal rate and etch uniformity are determined by the relative movement velocity function $v_{etch}$(R) for given plasma jet parameters and reactant concentration. For practical use the velocity of function $v_{etch}$(R) may be found by an experimental procedure provided by the following steps. In the first step, the velocity $v_{etch}$(R) may be taken as the velocity function providing uniform heating of the article. In the second step, one plasma jet pass along through the wafer is made. In the third step, etch removal thickness Δh(R) along article radius is measured in steps Δr. Average material removal thickness $\Delta h_{av}$ is calculated as $$\Delta h_{av} = \frac{\Delta r}{R_{max}} \sum_{R_i=R_{min}}^{R_i=R_{max}} \Delta h(R_i)$$

In the fourth step, the real etch removal thickness Δh(R) is compared with $\Delta h_{av}$ and if the difference between Δh(R) and $\Delta h_{av}$ is unacceptable then a new velocity function v*$_{etch}$(R) is calculated according to the relation v*$_{etch}$(R)=(Δh(R)/$\Delta h_{av}$)$v_{etch}$(R) and the procedure is repeated from the second step. If the difference between Δh(R) and $\Delta h_{av}$ is acceptable then the procedure is stopped and the optimal velocity function $v_{opt}$(R) may be used for uniform etching.

To obtain the etch removal thickness desired $\Delta h_{des}$, the velocity $v_{des}$(R) may be obtained from the function $v_{des}$(R)= ($\Delta h_{des}$/$\Delta h_{av}$)$v_{etch}$(R). Again, as described for determining the velocity function for heat treatment, a general iterative procedure similar to equation (iii) can be used to determine an optimum velocity profile for etching.

If the material layer thickness $H_{etch}$ to be removed is more then removal thickness Δh for one pass, the treatment is repeated until necessary etch depth is reached. The minimal necessary quantity N of the passes may be estimated as: N=$H_{etch}$/Δh.

If the etching is conducted through a polymer photo resist mask, the velocity function for relative movement of the plasma jet should be chosen to be more than the ablation threshold velocity for the polymer material to avoid ablation removal of the polymer mask.

To conduct plasma enhanced chemical deposition of a thin layer on a wafer surface at least one reactant gas which is able to produce a nonvolatile chemical substance on the wafer surface is added to the plasma jet 10. As an example, adding $SiH_4$ to the plasma jet 10 allows deposition of amorphous or poly Si if the plasma jet and process chamber ambient gases are inert. If a mixture of $SiH_4$ or silica organic substance vapor and oxygen is added to the plasma jet, silicon oxide film is deposited onto wafer surface.

For uniform material deposition the relative movement velocity $v_{dep}$(R) along wafer rotation radius is changed depending on distance between plasma jet at the wafer surface and wafer rotation axis to provide a deposited layer thickness at wafer surface points at all rotation radii that is equal to the deposited layer thickness at wafer surface point with minimal rotation radius.

In practice, the velocity function $v_{dep}$(R) may be found by routine experimental procedure by the following steps. In the first step, the velocity $v_{dep}$(R) may be taken as velocity providing uniform heating of the wafer. In the second step, one plasma jet pass along through the wafer is made. In the third step, material deposition thickness Δh(R) along wafer radius is measured in increments Δr. The average deposition thickness $\Delta h_{av}$ is calculated as $$\Delta h_{av} = \frac{\Delta r}{R_{max}} \sum_{R_i=R_{min}}^{R_i=R_{max}} \Delta h(R_i)$$

In the fourth step, the real deposition thickness Δh(R) is compared with $\Delta h_{av}$ and if the difference between Δh(R) and $\Delta h_{av}$ is unacceptable then a new velocity function V*dep is calculated according to the relation v*$_{dep}$(R)=(Δh(R)/$\Delta h_{av}$) $v_{dep}$(R) and the procedure is repeated from the second step.

If the difference between $\Delta h(R)$ and $\Delta h_{av}$ is acceptable then the procedure is stopped and found optimal velocity function $v_{opt}(R)$ may be used further for uniform deposition.

To achieve desirable deposition thickness $\Delta h d_{des}$ the velocity $v_{des}(R)$ may be obtained from the function: $v_{des}(R)=(\Delta h_{des}/\Delta h_{av})*v_{dep}(R)$. Again, as described for determining the velocity function for heat treatment, a general iterative procedure similar to equation (iii) can be used to determine an optimum velocity profile for deposition.

If the material layer thickness $H_{dep}$ to be deposited is more than the deposition thickness $\Delta h$ for one pass, the treatment steps are repeated until necessary layer thickness is reached. The minimum necessary quantity N of passes may be estimated as:

$N=H_{dep}/\Delta h$.

The methods described for article processing by heating, polymer ablation, etching and deposition may be combined to give multiple processes in a single run. The key factor is control of and capability to change the article temperature described in the above sections. Such an application is to pattern a polysilicon film through a photo resist mask, and then strip the mask in a single process: (1) pattern a polysilicon film by etching the film through a pattern photoresist mask at a low temperature, high average velocity, $v(R)>V_{abl}(R)$, and (2) follow by stripping the photoresist mask by an ablative process using inert gas, no chemically reactive gasses, at a higher temperature, lower average velocity, $V(R)<V_{abl}$.

As will be understood from the foregoing description, according to the present invention, the method may be employed for several plasma jet operations. It is to be understood that the embodiments described herein are merely illustrative of the principles of the invention. Various modifications may be made thereto by persons skilled in the art which will embody the principles of the invention and fall within the spirit and scope thereof. Hence, the present invention is deemed limited only by the appended claims and the reasonable interpretation thereof.

What is claimed is:

1. A method for treating the surface of an article with a plasma jet, the method comprising the steps of:
   (a) providing an article with a surface to be treated;
   (b) providing a plasma jet, the method being further characterized in that:
   (c) the article is rotated about a single axis, the single axis coincident with the article, wherein the rotation defines a rotation radius extending from the axis;
   (d) the article surface is contacted with the plasma jet to form a plasma jet footprint having a predetermined dimension on the article surface, wherein the size of the article surface is greater than the size of the plasma jet footprint; and
   (e) the plasma jet footprint is moved along the rotation radius in the radial direction according to a velocity profile along the rotation radius so as to apply heat to the article surface to obtain a desired temperature distribution profile on the article surface as a function of the rotation radius.

2. The method according to claim 1, wherein the method further comprises the steps of:
   (a) the temperature of the article surface is measured along the rotation radius to obtain a measured temperature distribution for the article surface along the rotation radius;
   (b) the measured temperature distribution for the article surface is compared with a desirable temperature distribution profile for the article surface, wherein the temperature distribution is a function of the rotation radius;
   (c) a second velocity profile for moving the plasma jet footprint relative to the article surface along the rotation radius that will obtain the desirable temperature distribution profile for the article surface as a function of the rotation radius is determined; and
   (d) the plasma jet footprint is moved relative to the article surface along the rotation radius according to the second velocity profile so as to heat the article surface to obtain the desirable temperature distribution profile.

3. The method according to claim 2, wherein the second velocity profile of the plasma jet footprint relative to the article surface along the rotation radius is determined according to the function $v_{des}(R)=((T_{heat}(R)-T_o)/(T_w(R)-T_o))*v(R)$, wherein vdes(R) is the velocity of the plasma jet footprint relative to the article surface at a point on the radius necessary to beat the article surface to a desired temperature, $T_{heat}(R)$ is the measured temperature of the article surface at the point on the radius, $T_o$ is the initial temperature of the article surface, $T_w(R)$ is a desired temperature for the article surface at the point on the radius, and v(R) is the initial velocity of the plasma jet footprint relative to the article surface at a point on the radius.

4. The method according to claim 3, wherein the temperature of the article can be controlled to a uniform temperature in the range of about 30° C. to 1200° C.

5. A method for treating the surface of an article with a plasma jet, the method comprising the steps of:
   (a) providing an article with a surface to be treated;
   (b) providing a plasma jet for etching material from the article surface, the method being further characterized in that:
   (c) the article is rotated about an axis, wherein the rotation defines a rotation radius extending from the axis;
   (d) the article surface is contacted with the plasma jet to form a plasma jet footprint having a predetermined dimension on the article surface;
   (e) the plasma jet footprint is moved relative to the article surface along the rotation radius according to a first velocity profile so as to remove material from the article surface;
   (f) the thickness of the article surface along the rotation radius is measured to obtain a measured thickness distribution for the article surface along the rotation radius;
   (g) the measured thickness distribution for the article is compared with a desirable thickness distribution profile for the article along the rotation radius;
   (h) a second velocity profile for moving the plasma jet footprint relative to the article surface along the rotation radius that will obtain the desirable thickness distribution profile for the article along the rotation radius is determined; and
   (i) the plasma jet footprint is moved relative to the article surface along the rotation radius according to the second velocity profile so as to remove material from the article surface to obtain the desirable thickness distribution profile.

6. The method according to claim 5, wherein the second velocity profile of the plasma jet footprint relative to the article surface along the rotation radius is determined according to the function $v_{des}(R)=(h_{des}/h_{av})*v_{etch}(R)$, wherein $v_{des}(R)$ is the desired velocity of the plasma jet footprint relative to the article surface at a point on the radius necessary to remove material from the article surface to obtain a desired thickness, $h_{des}$ is the desired thickness at the point on the radius, $h_{av}$ is the measured average thickness and $v_{etch}(R)$ is the initial velocity of the plasma jet footprint relative to the article surface at the point on the radius.

7. A method for treating the surface of an article with a plasma jet, the method comprising the steps of:

(a) providing an article with a surface to be treated;

(b) providing a plasma jet, the method being further characterized in that;

(c) the article is secured to a holder;

(d) the holder is rotated about a single axis that is coincident with the holder and the article, wherein the rotation defines a rotation radius extending from the axis;

(e) the article surface is contacted with the plasma jet to form a plasma jet footprint having a predetermined dimension on the article surface, wherein the size of the holder is greater than tie size of the plasma jet footprint; and (f) the plasma jet footprint is moved along the rotation radius in the radial direction according to a velocity profile along the rotation radius so as to apply heat to the article surface to obtain a desired temperature distribution profile on the article surface as a function of the rotation radius.

8. A method for treating the surface of an article with a plasma jet, the method comprising the steps of:

(a) providing an article with a surface to be treated;

(b) providing a plasma jet;

(c) rotating the article about an axis, wherein the rotation defines a rotation radius extending from the axis;

(d) contacting the article surface with the plasma jet to form a plasma jet footprint having a predetermined dimension on the article surface;

(e) moving the plasma jet footprint relative to the article surface along the rotation radius according to a first velocity profile so as to heat the article surface;

(f) measuring the temperature of the article surface along the rotation radius to obtain a measured temperature distribution for the article surface along the rotation radius;

(g) comparing the measured temperature distribution for the article surface with a desirable temperature distribution profile for the article surface, along the rotation radius;

(h) determining a second velocity profile for moving the plasma jet footprint relative to the article surface along the rotation radius that will obtain the desirable temperature distribution profile for the article surface along the rotation radius, wherein the second velocity profile of the plasma jet footprint relative to the article surface along the rotation radius is determined according to the function $vdes(R)=((T_{heat}(R)-T_o)/T_w(R)-T_o))*v(R)$, and wherein $vdes(R)$ is the velocity of the plasma jet footprint relative to the article surface at a point on the radius necessary to heat the article surface to a desired temperature, $T_{heat}$ is the measured temperature of the article surface at the point on the radius, $T_o$ is the initial temperature of the article surface, $T_w(R)$ is a desired temperature for the article surface at the point on the radius, and $v(R)$ is the initial velocity of the plasma jet footprint relative to the article surface at a point on the radius; and (i) moving the plasma jet footprint relative to the article surface along the rotation radius according to the second velocity profile so as to heat the article surface to obtain the desirable temperature distribution profile.

9. The method according to claim 8, wherein the temperature of the article can be controlled to a uniform temperature in the range of about 30° C. to 1200° C.

* * * * *